United States Patent
Shen

(10) Patent No.: US 11,817,322 B2
(45) Date of Patent: Nov. 14, 2023

(54) METHOD OF MANUFACTURING VIAS WITH PULSING PLASMA

(71) Applicant: NANYA TECHNOLOGY CORPORATION, New Taipei (TW)

(72) Inventor: Zhi-Xuan Shen, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 119 days.

(21) Appl. No.: 17/452,769

(22) Filed: Oct. 28, 2021

(65) Prior Publication Data
US 2023/0132759 A1 May 4, 2023

(51) Int. Cl.
H01L 21/311 (2006.01)
H01L 21/02 (2006.01)

(52) U.S. Cl.
CPC .... *H01L 21/31116* (2013.01); *H01L 21/0212* (2013.01); *H01L 21/0228* (2013.01); *H01L 21/31144* (2013.01)

(58) Field of Classification Search
None
See application file for complete search history.

(56) References Cited

U.S. PATENT DOCUMENTS

| | | | |
|---|---|---|---|
| 6,183,655 B1 * | 2/2001 | Wang | H01L 21/31116 438/743 |
| 9,570,313 B2 * | 2/2017 | Ranjan | H01J 37/32706 |
| 2017/0352543 A1 | 12/2017 | Park et al. | |
| 2019/0198338 A1 * | 6/2019 | Kim | H01L 21/0274 |

* cited by examiner

*Primary Examiner* — Stephanie P Duclair
(74) *Attorney, Agent, or Firm* — CKC & Partners Co., LLC

(57) ABSTRACT

A method of manufacturing a semiconductor, comprising: providing a stacked structure comprising a first oxide layer, a second oxide layer, and a metal layer stacked between the first oxide layer and the second oxide layer; forming a mask layer on the second oxide layer; introducing a gas mixture to the stacked structure, wherein the gas mixture comprises at least two hydrocarbon compounds and oxygen; and performing a pulsing plasma process to the stacked structure through the mask layer to pattern the second oxide layer and expose the metal layer through the patterned second oxide layer.

13 Claims, 5 Drawing Sheets

METHOD OF MANUFACTURING VIAS WITH PULSING PLASMA

BACKGROUND

Field of Disclosure

The present disclosure relates to a method of manufacturing vias with pulsing plasma.

Description of Related Art

Semiconductor industries are developing and improving the manufacturing process for semiconductor structures, while the miniature of the components continued. The accuracy of the scale and shape of the structure thus become more important. To create vias in a semiconductor structure, reaction ion etching methods are often used. The species of the ion particles are decided by the compounds of the plasma, which needs to consider the selective etching rate of the species of the ion particles between different materials. Suitable prescription for the etching process is necessary and indispensable.

SUMMARY

The disclosure provides a method of manufacturing vias with pulsing plasma.

According to an embodiment of the present disclosure, a method of manufacturing a semiconductor, comprising: providing a stacked structure comprising a first oxide layer, a second oxide layer, and a metal layer stacked between the first oxide layer and the second oxide layer; forming a mask layer on the second oxide layer; introducing a gas mixture to the stacked structure, wherein the gas mixture includes at least two hydrocarbon compounds and oxygen; and performing a pulsing plasma process to the stacked structure through the mask layer to pattern the second oxide layer and expose the metal layer through the patterned second oxide layer.

In an embodiment of the present disclosure, the forming the mask layer includes: forming a first covering layer on the second oxide layer; and patterning the first covering layer to expose at least one portion of a surface of the second oxide layer.

In an embodiment of the present disclosure, method further comprising: forming a second covering layer on the patterned first covering layer to cover and contact the at least one portion of the surface of the second oxide layer.

In an embodiment of the present disclosure, the forming the second covering layer is performed by using a blanket deposition process.

In an embodiment of the present disclosure, the second covering layer includes a high dielectric material.

In an embodiment of the present disclosure, the first covering layer includes zirconium oxide or hafnium oxide.

In an embodiment of the present disclosure, the method further comprising: forming another mask layer on the patterned second oxide layer; and performing another pulsing plasma process to the stacked structure through the another mask layer to form at least one via running through the first oxide layer, the metal layer, and the second oxide layer.

In an embodiment of the present disclosure, the forming the another mask layer includes: forming a first covering layer on the patterned second oxide layer; and forming a second covering layer on the another first covering layer to cover and contact at least one portion of a surface of the metal layer.

In an embodiment of the present disclosure, the forming the second covering layer is performed by using a blanket deposition process.

In an embodiment of the present disclosure, the second covering layer includes a high dielectric material.

In an embodiment of the present disclosure, the first covering layer includes zirconium oxide or hafnium oxide.

In an embodiment of the present disclosure, the performing the pulsing plasma process further form at least one via running through the first oxide layer, the metal layer, and the second oxide layer.

In an embodiment of the present disclosure, the at least two hydrocarbon compounds include a saturated hydrocarbon compound and an unsaturated hydrocarbon compound or include two unsaturated hydrocarbon compounds.

In an embodiment of the present disclosure, one of the at least two hydrocarbon compounds has an additional double bond comparing to another one of the at least two hydrocarbon compounds.

In an embodiment of the present disclosure, the metal layer includes tungsten.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
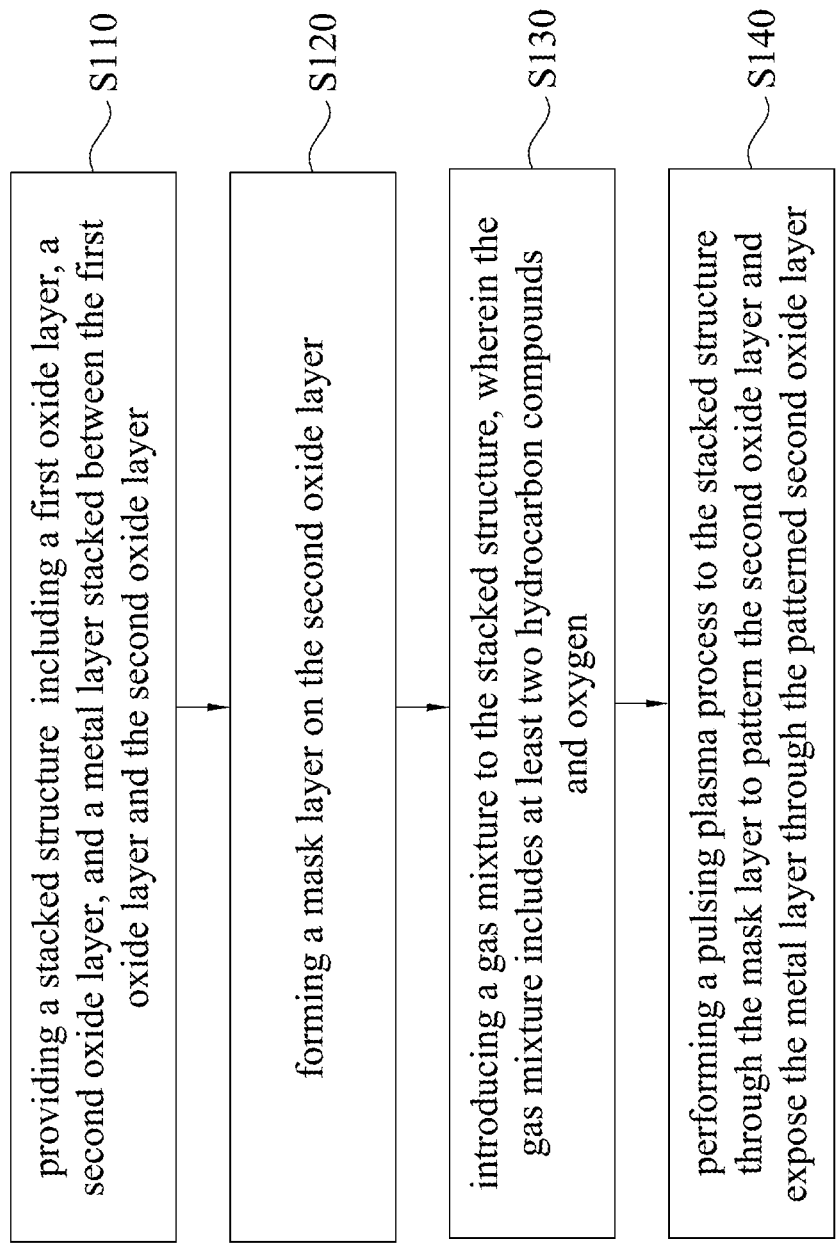
FIG. 1 is a flow chart of the method of manufacturing vias with pulsing plasma according to one embodiment of this disclosure.

Reference will now be made in detail to the present embodiments of the disclosure, examples of which are illustrated in the accompanying drawings. Wherever possible, the same reference numbers are used in the drawings and the description to refer to the same or like parts.

Reference is made to FIG. 1. FIG. 1 is a flow chart of a method M1 of manufacturing vias with pulsing plasma according to one embodiment of this disclosure. As shown in FIG. 1, the method M1 of manufacturing vias with pulsing plasma includes: providing a stacked structure including a first oxide layer, a second oxide layer, and a metal layer stacked between the first oxide layer and the second oxide layer (step S110); forming a mask layer on the second oxide layer (step S120); introducing a gas mixture to the stacked structure, wherein the gas mixture includes at least two hydrocarbon compounds and oxygen (step S130); and performing a pulsing plasma process to the stacked structure through the mask layer to pattern the second oxide layer and expose the metal layer through the patterned second oxide layer (step S140).

Figure 2B:
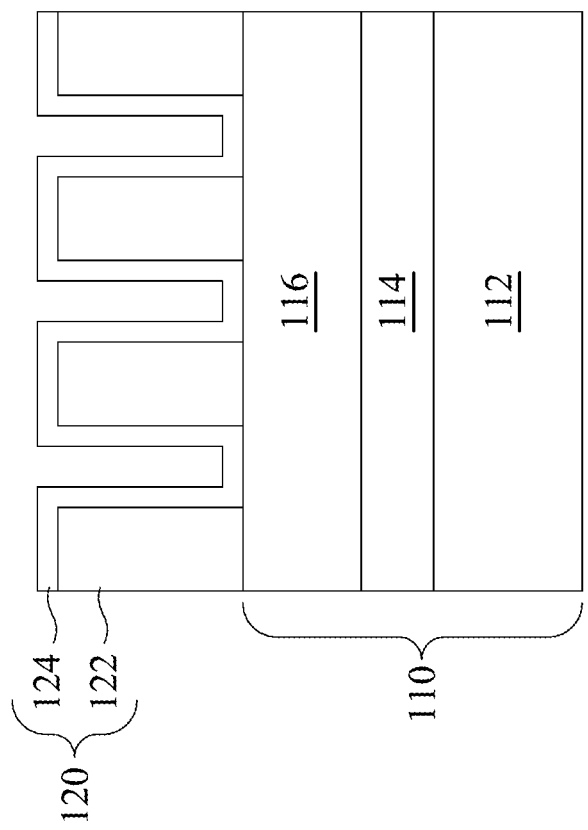
FIG. 2B is a schematic diagram showing an intermediate stage of the method according to one embodiment of this disclosure.
Figure 2A:
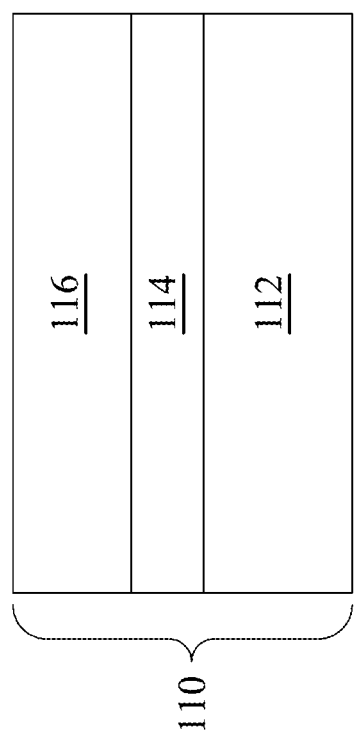
FIG. 2A is a schematic diagram showing an intermediate stage of the method according to one embodiment of this disclosure.

References are made to FIG. 2A and FIG. 1. FIG. 2A is a schematic diagram showing an intermediate stage of the method according to one embodiment of this disclosure. As shown in FIG. 2A and FIG. 1, a stacked structure 110 is provided in step S110. The stacked structure 110 is formed by sequentially stacking a first oxide layer 112, a metal layer 114, and a second oxide layer 116. In an embodiment, the metal layer 114 includes tungsten. In practical applications, the metal layer 114 may include other metal. In some embodiments, the thickness of the metal layer 114 may be about 80 nm. In some embodiments, the thickness ratio of the first oxide layer 112, the metal layer 114, and the second oxide layer 116 is 2:1:1. However, any suitable thickness of the first oxide layer 112, the metal layer 114 and the second oxide layer 116 may be utilized.

References are made to FIG. 2B and FIG. 1. FIG. 2B is a schematic diagram showing an intermediate stage of the method according to one embodiment of this disclosure. As shown in FIG. 2B and FIG. 1, a mask layer 120 is provided in step S120. The mask layer 120 may include multiple sublayers, and different sublayers may be formed by using different processes. In an embodiment, step S120 includes: forming a first covering layer on the second oxide layer (step S121); and patterning the first covering layer to expose at least one portion of a surface of the second oxide layer (step S122). Specifically, in step S121, the first covering layer 122 may be deposited over the second oxide layer 116 by using any suitable deposition process, such as chemical vapor deposition, physical vapor deposition, the combination of thereof, or the likes. In an embodiment, the first covering layer 122 includes zirconium oxide or hafnium oxide, but the preset disclosure is not limited to this. After the deposition of the first covering layer 122, step S122 is performed in order to pattern the first covering layer 122. The first covering layer 122 may be patterned by using, such as a photolithography process, but the present disclosure is not limited to this. Reference is made to FIG. 2B. In an embodiment, after the first covering layer 122 is patterned, the patterned first covering layer 122 will expose some portions of the top surface of the second oxide layer 116. The portions which are unexposed by the patterned first covering layer 122 may be protected by the patterned first covering layer 122 until the patterned first covering layer 122 is fully removed.

Reference is made to FIG. 2B. Step S120 further includes: forming a second covering layer on the patterned first covering layer to cover and contact the at least one portion of the surface of the second oxide layer (step S123). In an embodiment, the mask layer 120 includes a first covering layer 122 and a second covering layer 124, but the present disclosure is not limited to this. Any suitable number of the sublayers of the mask layer 120 may be utilized. In an embodiment, step S123 is performed by using a blanket deposition process. The second covering layer 124 is conformally formed over the second oxide layer 116 and the first covering layer 122. Specifically, in FIG. 2B, the second covering layer 124 contacts with some portions of the top surface of the second oxide layer 116 and the top surface and the sidewalls of the patterned first covering layer 122, but the present disclosure is not limited to this. The second covering layer 124 may help to reduce the side etching of the vias during the following pulsing plasma process, and thus enhance the straightness of the side walls of the vias. For example, in step S123, the second covering layer 124 is deposited by using, such as an atomic layer deposition process. In an embodiment, the second covering layer 124 includes a high dielectric material, but the preset disclosure is not limited to this. The thickness of the mask layer 120 (including the thickness of the first covering layer 122 and the thickness of the second covering layer 124) may be about 180 nm. However, any suitable thickness of the second covering layer 124 may be utilized.

Figure 2D:
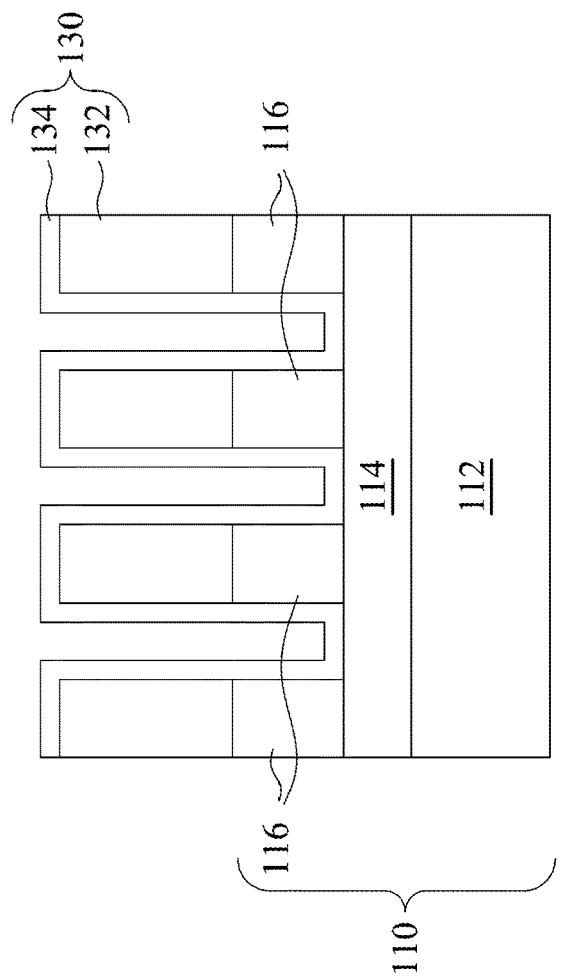
FIG. 2D is a schematic diagram showing an intermediate stage of the method according to one embodiment of this disclosure.
Figure 2C:
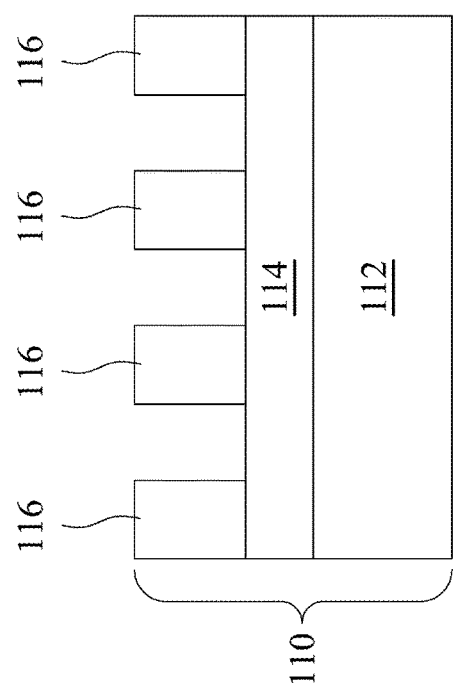
FIG. 2C is a schematic diagram showing an intermediate stage of the method according to one embodiment of this disclosure.

Reference is made to FIG. 2C. FIG. 2C is a schematic diagram showing an intermediate stage of the method according to one embodiment of this disclosure. As shown in FIG. 2C and FIG. 1, after forming the second covering layer 124, a gas mixture is introduced in step S130. The gas mixture is used for producing plasma with specific element and ion compounds, which may provide a suitable selective etching rate between the stacked structure 110 and the mask layer 120. The compounds of the gas mixture that is used for the following pulsing plasma process may mainly be decided by the etching rates thereof to the materials of the metal layer 114, the first covering layer 122, and the second covering layer 124. The gas mixture includes at least two hydrocarbon ($C_xF_y$) compounds and oxygen to provide a suitable selective etching rate between the metal layer 114 and the mask layer 120 (which includes the first covering layer 122 and the second covering layer 124).

Specifically, in an embodiment, the at least two hydrocarbon compounds include a saturated hydrocarbon compound and an unsaturated hydrocarbon compound or include two unsaturated hydrocarbon compounds. For example, the saturated hydrocarbon compound may be such as $CF_4$, or the likes, and the unsaturated hydrocarbon compound may be such as $C_4F_6$, $C_4F_8$, or the likes, but the present disclosure is not limited to this. Any suitable hydrocarbon compound that satisfies the definition of saturated or unsaturated may be utilized. The at least two hydrocarbon compounds thus may be selected from the above gases, such as $CF_4$ and $C_4F_6$, which is an example for the gas mixture with the combination of a saturated hydrocarbon compound and an unsaturated hydrocarbon compound, or possibly, a gas mixture including $C_4F_6$ and $C_4F_8$ provides an example for the case in which the gas mixture includes two unsaturated hydrocarbon compounds. The ratio between the two or more compounds of the gas mixture may be decided according to the selective etching rate between the materials of the mask layer 120 and the stacked structure 110, but any suitable compounds ratio may be utilized. In another embodiment, one of the at least two hydrocarbon compounds has an additional double bond comparing to another one of the at least two hydrocarbon compounds. For example, in an embodiment, the compound of the gas mixture may include $C_4F_8$ and $C_5F_8$, in which $C_4F_8$ includes four single bonds between the carbon elements, while $C_5F_8$ includes four single bonds and one double bond between the carbon elements. However, any suitable hydrocarbon compound that satisfies the relation may be utilized.

References are made to FIG. 2C and FIG. 1. After the gas mixture is introduced, the pulsing plasma process is performed in step S140. An electric field is applied to the stacked structure 110, which may attract the ion particles of the plasma moving along a direction and collide with the stacked structure 110. The electric field may be provided by applying a bias between two electrically separated electrodes. The electric intensity of the electric field may be controlled by adjusting the bias which is applied on the electrodes. For example, pulsing biases applied on the electrodes may create pulsing electric field utilized in the pulsing plasma process. The bias power may be about 4000 W, but the present disclosure is not limited to this. Any suitable bias power may be utilized. While the electric field is applied, the ion particles of the plasma will collide with the stacked structure 110. More specifically, the ion particles will collide with the mask layer 120 and the portions of the second oxide layer 116 which are exposed by the mask layer 120. Taking tungsten as the material of the metal layer 114 for example, during applying electric field, the collision between the tungsten and the ion particles produces highly volatile reactants, such as $WF_6$, or the likes, which will be pumped out by a gas pump. One of the reasons for choosing pulsing plasma to etch the stacked structure 110 is to better control the etching process by reducing any uncontrollable particles (such as reactant particles) that will leads to unwanted etching profile.

Reference is made to FIG. 2D. FIG. 2D is a schematic diagram showing an intermediate stage of the method according to one embodiment of this disclosure. As shown in FIG. 2D, the etching process of the method M1 may include multiple pulsing plasma processes, and each pulsing plasma process may aim to etch different layers of the stacked structure 110, but the present disclosure is not limited to this. For example, in an embodiment, the method M1 further includes: forming another mask layer on the patterned second oxide layer (step S150); and performing another pulsing plasma process to the stacked structure through the another mask layer to form at least one via running through the first oxide layer, the metal layer, and the second oxide layer (step S160). The reason to perform multiple steps of pulsing plasma is to develop a suitable prescription of the gas mixture and the parameters that are used during the pulsing plasma process for providing vias with highly straightness sidewalls, but the present disclosure is not limited to this.

Specifically, after the second oxide layer 116 is etched by the first pulsing plasma process as shown in FIG. 2C, another mask layer 130 is formed over the patterned second oxide layer 116. In an embodiment, step S150 includes: forming another first covering layer on the patterned second oxide layer (step S151); and forming another second covering layer on the another first covering layer to cover and contact at least one portion of a surface of the metal layer (step S152). For example, the another mask layer 130 may also include multiple sublayers, such as the another first covering layer 132 and the another second covering layer 134 which are shown in FIG. 2D. The formation of the another first covering layer 132 and the another second covering layer 134 may be similar or the same as the formation of the first covering layer 122 and the second covering layer 124 described above, but the present disclosure is not limited to this. Any suitable process may be utilized. Additionally, the materials and the thicknesses of the another first covering layer 132 and the another second covering layer 134 may be similar or the same as those of the first covering layer 122 and the second covering layer 124 described above. For example, in an embodiment, the another first covering layer 132 includes zirconium oxide or hafnium oxide. However, any suitable materials and thicknesses may be utilized.

Figure 3:
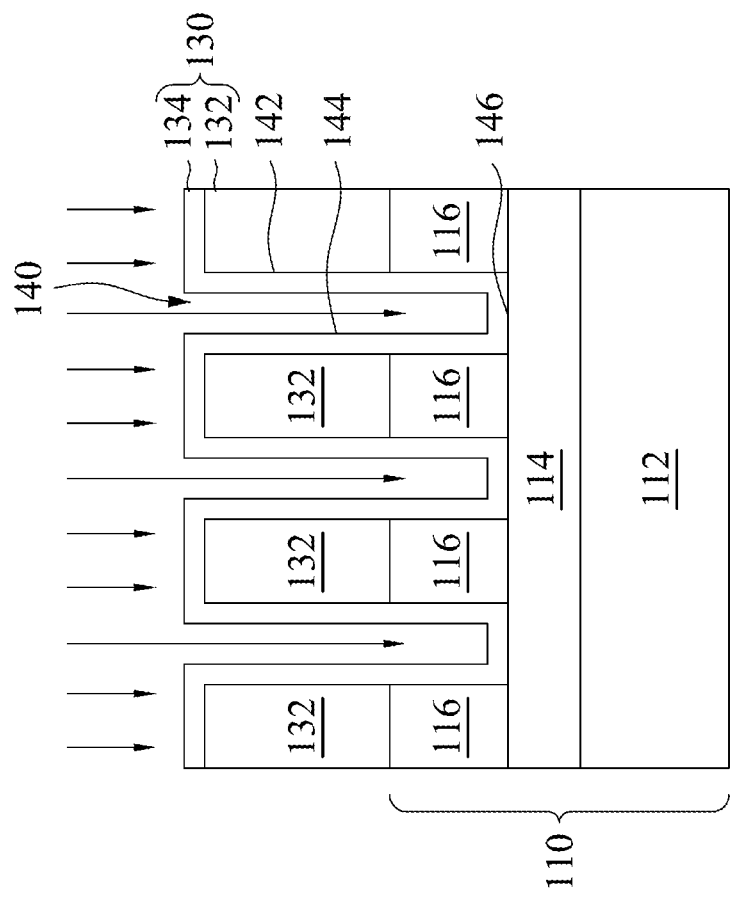
FIG. 3 is an enlarge view of FIG. 2D according to one embodiment of this disclosure.

References are made to FIG. 2D and FIG. 3. FIG. 3 is an enlarge view of FIG. 2D according to one embodiment of this disclosure. As shown in FIG. 2D and FIG. 3, the another mask layer 130 is formed over the stacked structure 110. Specifically, in an embodiment, the another second covering layer 134 is performed by using a blanket deposition process. The another second covering layer 134 is conformally formed over the second oxide layer 116 and the another first covering layer 132. Specifically, in FIG. 2D, the another second covering layer 134 contacts with some portions of the top surface of the metal layer 114 and the top surface and the sidewalls of the another first covering layer 132 and the second oxide layer 116, but the present disclosure is not limited to this. The another second covering layer 134 may help to reduce the side etching during the following pulsing plasma process, and thus enhance the straightness of the side walls of the vias. For example, the another second covering layer 134 is deposited by using, such as an atomic layer deposition process. In an embodiment, the another second covering layer 134 includes a high dielectric material, but the preset disclosure is not limited to this.

Specifically, in FIG. 3, the left sidewall and the right side wall of the opening 140 are defined by the first side wall 142 and the second side wall 144 respectively, and the bottom wall 146 of the opening 140 is defined by the top surface of the metal layer 114 which is exposed by the another first covering layer 132 and the second oxide layer 116. The top surface of the another first covering layer 132, the first side wall 142, the second side wall 144, and the bottom wall 146 are covered by the another second covering layer 134. The another first covering layer 132 and the another second covering layer 134 protect the patterned second oxide layer 116 and portions of the metal layer 114 and the first oxide layer 112 beneath. The adopted pulsing plasma process may be an anisotropic etching process, which may has higher etching rate along one certain direction (such as a first direction A1), while has less etching rate in other directions (such as a second direction A2). During the pulsing plasma process, surface etching is achieved by the collisions between the ion particles and the surface of the stacked structure 110. In the embodiment as shown in FIG. 3, the first direction A1 may be perpendicular to the top surface of the another first covering layer 132 and the bottom wall 146, while the second direction A2 may be perpendicular to the first side wall 142 and the second side wall 144. The portions of the stacked structure 110 which are covered by the mask layer 130 may be retained after the etching process. However, the portions exposed by the opening 140 are only protected by the another second covering layer 134 and may be etched more or less during the procedure. The another second covering layer 134 can protect the first side wall 142 and the second side wall 144 from side etching, thus to improve the straightness of the side walls, while letting the ion particles to collide with the bottom wall 146 and extend the opening 140 through the metal layer 114 and the first oxide layer 112. The top surface of the second oxide layer 116 is protected by the another first covering layer 132 and the another second covering layer 134, and thus will be retained after the etching process.

Figure 2E:
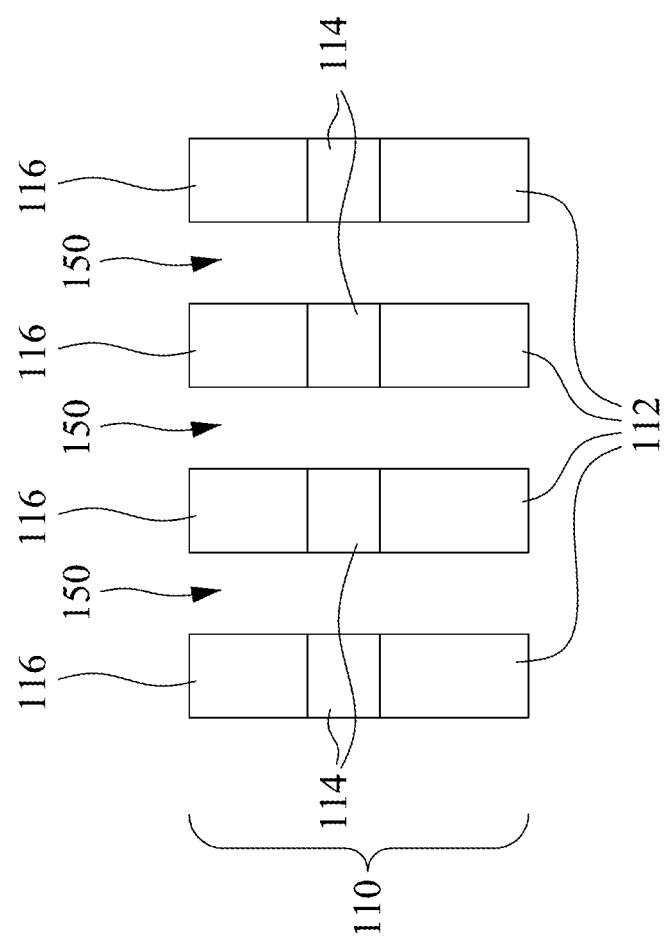
FIG. 2E is a schematic diagram showing an intermediate stage of the method according to one embodiment of this disclosure.

Reference is made to FIG. 2E. FIG. 2E is a schematic diagram showing an intermediate stage of the method according to one embodiment of this disclosure. As shown in FIG. 2E, after finishing multiple pulsing plasma processes, vias 150 that penetrate through the stacked structure 110 are formed. In an embodiment, step S160 further forms at least one via running through the first oxide layer 112, the metal layer 114, and the second oxide layer 116. Further, after confirming the suitable prescription of the gas mixture and the parameters that are used during the pulsing plasma process, the multiple pulsing plasma processes may be simplified to one pulsing plasma process, and thus reduce the cost of manufacturing. The one-time execution of the pulsing plasma process may be similar to or the same as the pulsing plasma process described above. However, any suitable methods can be utilized.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of manufacturing a semiconductor, comprising:
   providing a stacked structure comprising a first oxide layer, a second oxide layer, and a metal layer stacked between the first oxide layer and the second oxide layer;
   forming a mask layer on the second oxide layer;
   introducing a gas mixture to the stacked structure, wherein the gas mixture comprises at least two hydrocarbon compounds and oxygen; and
   performing a pulsing plasma process to the stacked structure through the mask layer to pattern the second oxide layer and expose the metal layer through the patterned second oxide layer,
   wherein the forming the mask layer comprises:
      forming a first covering layer on the second oxide layer; and
      patterning the first covering layer to expose at least one portion of a surface of the second oxide layer, wherein the first covering layer comprises zirconium oxide or hafnium oxide.

2. The method of claim 1, further comprising:
   forming a second covering layer on the patterned first covering layer to cover and contact the at least one portion of the surface of the second oxide layer.

3. The method of claim 2, wherein the forming the second covering layer is performed by using a blanket deposition process.

4. The method of claim 2, wherein the second covering layer comprises a high dielectric material.

5. The method of claim 1, further comprising:
   forming another mask layer on the patterned second oxide layer; and
   performing another pulsing plasma process to the stacked structure through the another mask layer to form at least one via running through the first oxide layer, the metal layer, and the second oxide layer.

6. The method of claim 5, wherein the forming the another mask layer comprises:
   forming a first covering layer on the patterned second oxide layer; and
   forming a second covering layer on the first covering layer to cover and contact at least one portion of a surface of the metal layer.

7. The method of claim 6, wherein the forming the second covering layer is performed by using a blanket deposition process.

8. The method of claim 6, wherein the second covering layer comprises a high dielectric material.

9. The method of claim 6, wherein the first covering layer comprises zirconium oxide or hafnium oxide.

10. The method of claim 1, wherein the performing the pulsing plasma process further form at least one via running through the first oxide layer, the metal layer, and the second oxide layer.

11. The method of claim 1, wherein the at least two hydrocarbon compounds comprise a saturated hydrocarbon compound and an unsaturated hydrocarbon compound or comprise two unsaturated hydrocarbon compounds.

12. The method of claim 1, wherein one of the at least two hydrocarbon compounds has an additional double bond comparing to another one of the at least two hydrocarbon compounds.

13. The method of claim 1, wherein the metal layer comprises tungsten.

* * * * *